(12) United States Patent
Hase (10) Patent No.: US 10,171,044 B2
(45) Date of Patent: *Jan. 1, 2019

(54) POWER AMPLIFICATION CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,331

(22) Filed: Jul. 10, 2017

(65) Prior Publication Data

US 2017/0310286 A1 Oct. 26, 2017

Related U.S. Application Data

(63) Continuation of application No. 15/421,862, filed on Feb. 1, 2017, now Pat. No. 9,735,744.

(30) Foreign Application Priority Data

Feb. 9, 2016 (JP) ................................. 2016-023057

(51) Int. Cl.
*H03F 1/56* (2006.01)
*H03F 3/193* (2006.01)
*H03F 3/21* (2006.01)
*H03F 1/02* (2006.01)

(52) U.S. Cl.
CPC ............ *H03F 1/56* (2013.01); *H03F 1/0266* (2013.01); *H03F 3/193* (2013.01); *H03F 3/21* (2013.01); *H03F 2200/222* (2013.01); *H03F 2200/318* (2013.01); *H03F 2200/387* (2013.01); *H03F 2200/411* (2013.01); *H03F 2200/451* (2013.01); *H03F 2200/555* (2013.01)

(58) Field of Classification Search
USPC ................ 330/285, 296, 310, 267, 273, 136
See application file for complete search history.

(56) References Cited

U.S. PATENT DOCUMENTS 7,936,219 B2    5/2011  Matsuzuka
2005/0179484 A1  8/2005  Sasho

FOREIGN PATENT DOCUMENTS

JP       2005-228196 A      8/2005

*Primary Examiner* — Hieu Nguyen
(74) *Attorney, Agent, or Firm* — Pearne & Gordon LLP (57) ABSTRACT

A power amplification circuit includes: a first amplifier that is input with a first signal and outputs a second signal; a bias circuit that supplies a bias current or voltage to the first amplifier; and a control voltage generating circuit that generates a control voltage in accordance with the first signal. The bias circuit includes a first transistor that outputs the bias current or voltage, a second transistor provided between the emitter or source of the first transistor and ground, and a third transistor that is supplied with the control voltage and that supplies a first current or voltage to the second transistor. The value of the first current or voltage when the signal level is a first level is larger than the value of the first current or voltage when the signal level is a second level. The first level is higher than the second level.

7 Claims, 5 Drawing Sheets

POWER AMPLIFICATION CIRCUIT

This application is a continuation of U.S. patent application Ser. No. 15/421,862 filed on Feb. 1, 2017 which claims priority from Japanese Patent Application No. 2016-023057 filed on Feb. 9, 2016. The content of this application is incorporated herein by reference in its entirety.

BACKGROUND

The present disclosure relates to power amplification circuits.

A power amplification circuit is used in a mobile communication device such as a cellular phone in order to amplify the power of a radio frequency (RF) signal to be transmitted to a base station. A bias circuit is used in such a power amplification circuit. The bias circuit is for supplying a bias current or bias voltage to a power amplification transistor. For example, in Japanese Unexamined Patent Application Publication No. 2005-228196, a bias circuit is disclosed that is formed of diode-connected transistors TR2 and TR3, a rectifying emitter-follower transistor TR4 and a constant-current-source transistor TR5.

Gain expansion may occur in a power amplification circuit at the time of intermediate power output. Since the linearity of the gain of the power amplification circuit is lost due to the occurrence of the gain expansion, the linearity of the power amplification circuit is degraded. In order to deal with this problem, for example, a configuration has been considered in which the transistor TR5, which operates as a constant current source, is provided between the emitter of the transistor TR4 and a reference potential, as in the bias circuit disclosed in Japanese Unexamined Patent Application Publication No. 2005-228196. Thus, variations in the emitter voltage of the transistor TR4 that occur as the amplitude of a high-frequency signal increases are suppressed. In addition, increases in the average value of the bias current at the time of intermediate power output are also suppressed. Thus, gain expansion of the high-frequency amplification transistor TR1 is suppressed and the linearity of the power amplification circuit is improved. However, in the bias circuit, since the transistor TR5 is always in an on state even at the time of small signal input, a constant amount of current flows to the transistor TR5. Therefore, there is a problem in that the power addition efficiency at the time of a small input signal decreases because the current consumption of the bias circuit does not decrease in spite of the current consumption of the transistor TR1 falling at the time of a small signal input. Here, the term "gain expansion", refers to an increase in gain that occurs with an increase in output power in an intermediate power output region.

BRIEF SUMMARY

The present disclosure was made in light of the above-described circumstances and provides a power amplification circuit that reduces the current consumption of a bias circuit at the time of small power output in the power amplification circuit while suppressing gain expansion at the time of intermediate power output in the power amplification circuit.

A power amplification circuit according to an embodiment of the present disclosure includes: a first amplifier that is input with a first signal and outputs a second signal obtained by amplifying the first signal; a bias circuit that supplies a bias current or a bias voltage to the first amplifier; and a control voltage generating circuit that generates a control voltage in accordance with a signal level of the first signal. The bias circuit includes a first transistor that outputs the bias current or bias voltage from an emitter or source thereof, a second transistor that is provided between the emitter or source of the first transistor and ground, and a third transistor that has the control voltage supplied to a base or gate thereof and that supplies from an emitter or source thereof a first current or voltage to a base or gate of the second transistor. A value of the first current or voltage in a case where the signal level of the first signal is a first level is larger than the value of the first current or voltage in a case where the signal level of the first signal is a second level. The first level is higher than the second level.

According to the embodiment of the present disclosure, a power amplification circuit can be provided that reduces the current consumption of a bias circuit at the time of small power output in the power amplification circuit while suppressing gain expansion at the time of intermediate power output in the power amplification circuit.

Other features, elements, characteristics and advantages of the present disclosure will become more apparent from the following detailed description of embodiments of the present disclosure with reference to the attached drawings.

DETAILED DESCRIPTION

Hereafter, an embodiment of the present disclosure will be described in detail while referring to the drawings. In addition, elements that are the same as each other will be denoted by the same symbols and repeated description thereof will be omitted.

Figure 1:
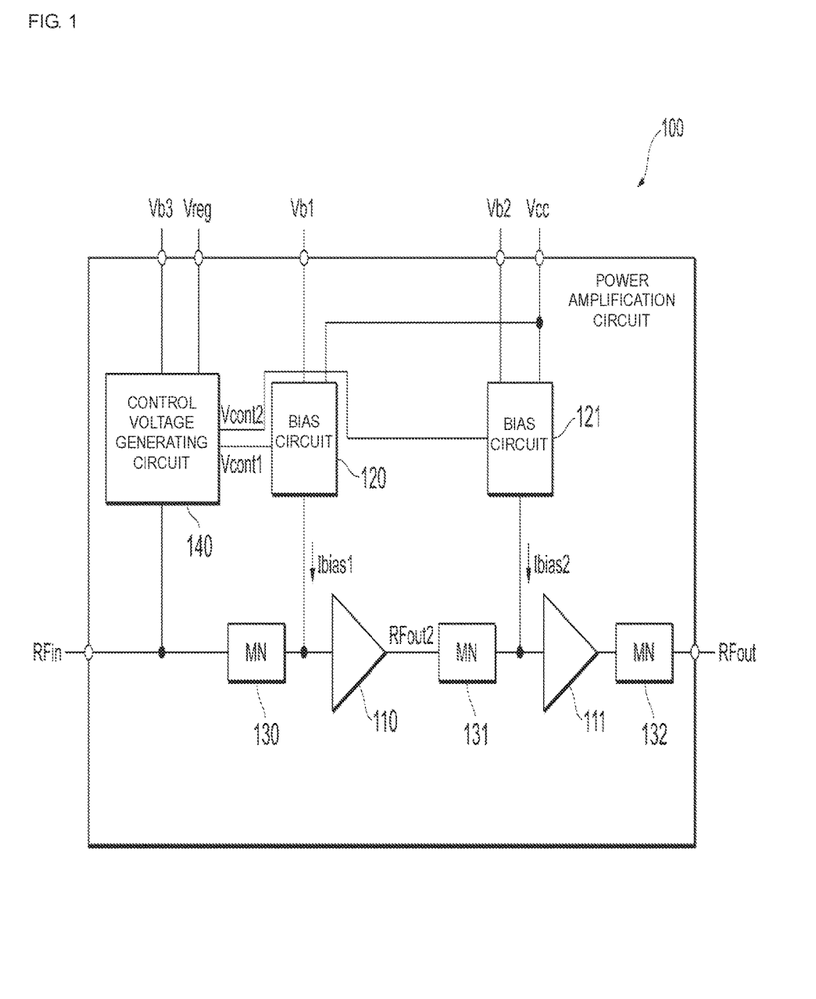
FIG. 1 illustrates the configuration of a power amplification circuit according to an embodiment of the present disclosure.

FIG. 1 illustrates the configuration of a power amplification circuit 100 according to an embodiment of the present disclosure. The amplification circuit 100 amplifies an RF signal RFin and outputs an output signal RFout.

As illustrated in FIG. 1, the power amplification circuit 100 includes amplifiers 110 and 111, bias circuits 120 and 121, matching networks 130, 131 and 132, and a control voltage generating unit 140.

The amplifiers 110 and 111 form a two-stage amplification circuit. The amplifier 110 (first amplifier) (drive stage) amplifies the RF signal RFin (first signal) input via the matching network 130 and outputs an RF signal RFout2 (second signal). The RF signal RFout2 output from the amplifier 110 is input to the amplifier 111 via the matching network 131. The amplifier 111 (power stage) amplifies the RF signal RFout2 and outputs the output signal RFout via the matching network 132.

Figure 2:
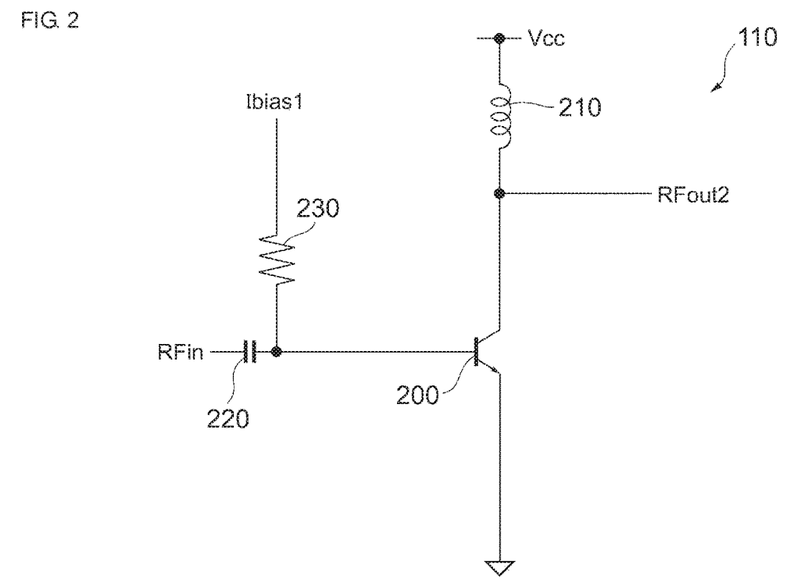
FIG. 2 illustrates an example of the configuration of an amplifier.

FIG. 2 illustrates an example of the configuration of the amplifier 110. As illustrated in FIG. 2, the amplifier 110 includes a bipolar transistor 200, an inductor 210, a capacitor 220 and a resistance element 230. A power supply voltage Vcc is supplied to the collector of the bipolar transistor 200 via the inductor 210, the RF signal RFin is input to the base of the bipolar transistor 200 via the capacitor 220 and the bipolar transistor 200 has a common emitter. In addition, a bias current Ibias1 or a bias voltage is supplied to the base of the bipolar transistor 200 via the resistance element 230. The RF signal RFout2 is output from the collector of the bipolar transistor 200. The amplifier 111 has the same configuration. The number of amplifier stages is not limited to two and may be one or three or more. In addition, in this embodiment, description is given using a heterojunction bipolar transistor (HBT) as an example of the transistor, but a metal-oxide-semiconductor field effect transistor (MOSFET) may be used as the transistor instead.

Returning to FIG. 1, the bias circuit 120 supplies a bias current or bias voltage to the amplifier 110 and the bias circuit 121 supplies a bias current or bias voltage to the amplifier 111. In this embodiment, the bias circuits 120 and 121 supply bias currents Ibias1 and Ibias2 to the amplifiers 110 and 111, respectively. The bias currents Ibias1 and Ibias2 are respectively adjusted on the basis of voltages Vb1 and Vb2, which are supplied from outside the power amplification circuit 100, and control voltages Vcont1 and Vcont2, which are supplied from the control voltage generating unit 140. The details of the configuration of the bias circuits 120 and 121 will be described later.

The matching networks 130, 131 and 132 are provided in order to match the impedances between circuits. The matching networks 130, 131 and 132 are formed using inductors and capacitors, for example.

The control voltage generating unit 140 generates the control voltages Vcont1 and Vcont2 in accordance with the signal level of the RF signal RFin. The control voltages Vcont1 and Vcont2 are adjusted on the basis of a voltage Vb3 and a voltage Vreg supplied from outside the power amplification circuit 100. The details of the control voltage generating unit 140 will be described later.

Figure 3:
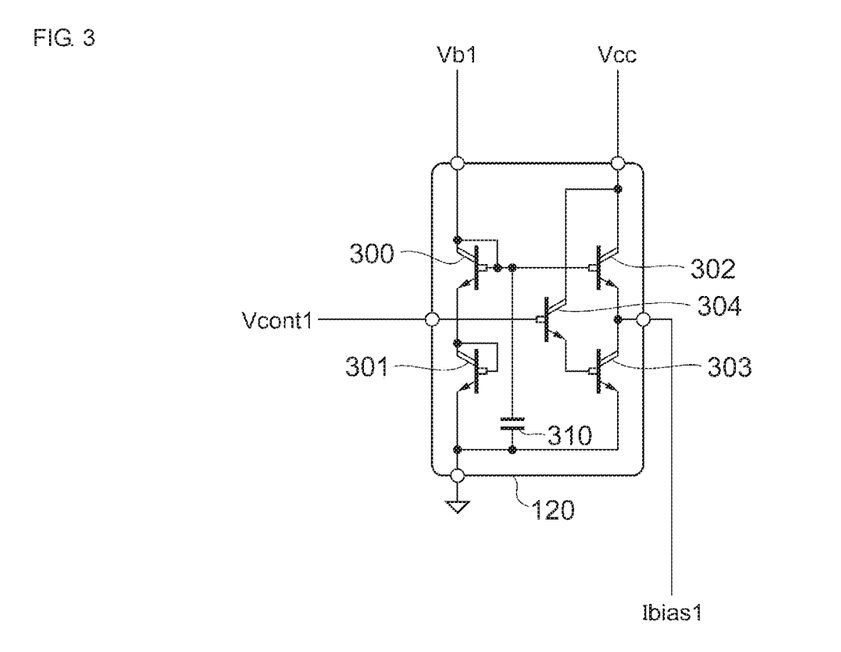
FIG. 3 illustrates an example of the configuration of a bias circuit.

FIG. 3 illustrates an example of the configuration of the bias circuit 120. The configuration of the bias circuit 121 is the same as that of the bias circuit 120 and therefore detailed description thereof is omitted.

As illustrated in FIG. 3, the bias circuit 120 includes bipolar transistors 300, 301, 302, 303 and 304, and a capacitor 310.

The bipolar transistors 300 and 301 and the capacitor 310 are configured to generate a voltage of a prescribed level. Specifically, the collector and the base of the bipolar transistor 300 are connected to each other (hereafter, "diode connected"), the voltage Vb1 is supplied to the collector of the bipolar transistor 300 and the emitter of the bipolar transistor 300 is connected to the collector of the bipolar transistor 301. The bipolar transistor 301 is diode connected, the collector thereof is connected to the emitter of the bipolar transistor 300, and the emitter thereof is connected to ground. A first terminal of the capacitor 310 is connected to the base of the bipolar transistor 300 and a second terminal of the capacitor 310 is grounded.

With the above-described configuration, a voltage of a prescribed level (for example, around 2.6 V) is generated at the base of the bipolar transistor 300. Diodes may be used instead of the bipolar transistors 300 and 301.

The power supply voltage Vcc is supplied to the collector of the bipolar transistor 302 (first transistor), the base of the bipolar transistor 302 is connected to the base of the bipolar transistor 300, and the emitter of the bipolar transistor 302 is connected to the collector of the bipolar transistor 303 (second transistor). The bias current Ibias1 is supplied from the emitter of the bipolar transistor 302 to the amplifier 110 (for example, base of bipolar transistor 200).

The collector of the bipolar transistor 303 (second transistor) is connected to the emitter of the bipolar transistor 302, the base of the bipolar transistor 303 is connected to the emitter of the bipolar transistor 304 (third transistor) and the bipolar transistor 303 has a common emitter. The bipolar transistor 303 has a function of adjusting the current between the emitter of the bipolar transistor 302 and the ground in accordance with the current supplied to the base of the bipolar transistor 303.

The power supply voltage Vcc is supplied to the collector of the bipolar transistor 304 (third transistor), the control voltage Vcont1 is supplied to the base of the bipolar transistor 304 and the emitter of the bipolar transistor 304 is connected to the base of the bipolar transistor 303. The bipolar transistor 304 has a function of adjusting the current supplied to base of the bipolar transistor 303 (first current) in accordance with the control voltage Vcont1 supplied from the control voltage generating unit 140.

Next, operation of the bias circuit 120 will be described. In the case where the signal level of the RF signal RFin input to the power amplification circuit 100 is comparatively large (first level) and the power of the output signal RFout is comparatively large (hereafter, "at time of intermediate power output"), the bias circuit 120 causes the currents flowing to the bipolar transistor 304 and the bipolar transistor 303 to increase. Thus, a current that flows back from the Ibias1 terminal caused by the high-frequency amplitude operation of the amplifier 110 can be made to flow to the ground terminal as the collector-emitter current of the bipolar transistor 303. Therefore, an increase in the emitter current of the bipolar transistor 302 caused by the rectification characteristics generated by the diode composed of the base-emitter junction of the bipolar transistor 302 can be suppressed. Therefore, gain expansion caused by an increase in the bias current at the time of intermediate power output decreases.

In contrast, in the case where the signal level of the RF signal RFin input to the power amplification circuit 100 is comparatively small (second level) and the power of the output signal RFout is comparatively small (hereafter, "at time of small power output"), the bias circuit 120 causes the currents flowing to the bipolar transistor 304 and the bipolar transistor 303 to decrease. Thus, the current between the emitter of the bipolar transistor 302 and the ground is made to decrease. Here, the current that flows back from the Ibias1 terminal described above is small at the time of small power output compared with at the time of intermediate power output. Therefore, the collector-emitter current of the bipolar transistor 303 that is required to suppress an increase in the emitter current of the bipolar transistor 302 is also small. Therefore, even when the current flowing through the bipolar transistor 303 is reduced in conjunction with a decrease in the signal level of the RF signal RFin, gain expansion can be sufficiently suppressed, and current consumption can also be reduced.

Next, a method of generating the control voltage Vcont1 that controls the bipolar transistors 303 and 304 will be described while referring to FIG. 4. The method of generating the control voltage Vcont2 is the same as for the control voltage Vcont1 and therefore detailed description thereof is omitted.

Figure 4:
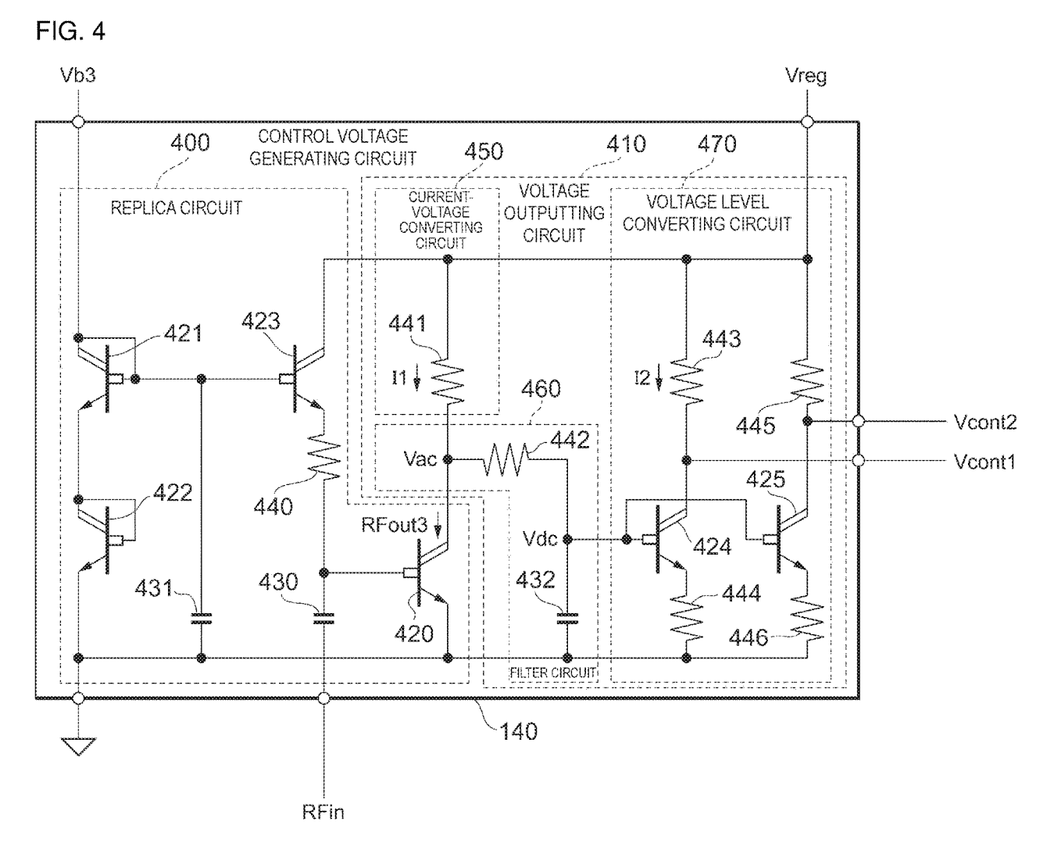
FIG. 4 illustrates an example of the configuration of a control voltage generating circuit.

FIG. 4 illustrates an example of the configuration of the control voltage generating circuit 140. As illustrated in FIG. 4, the control voltage generating unit 140 includes a replica circuit 400 and a voltage outputting circuit 410.

The replica circuit 400 is a circuit that imitates the amplification operation of the amplifier 110. In other words, similarly to the amplifier 110, the replica circuit 400 amplifies the RF signal RFin and outputs an RF signal RFout3 (third signal). The RF signal RFout3 is converted into a voltage value in the voltage outputting circuit 410. The control voltages Vcont1 and Vcont2 are generated on the basis of this voltage. Hereafter, the configuration of each of the circuits included in the control voltage generating unit 140 will be described in detail.

The replica circuit 400 includes bipolar transistors 420, 421, 422 and 423, capacitors 430 and 431 and a resistance element 440.

The bipolar transistor 420 (second amplifier) imitates the amplification operation of the bipolar transistor 200 of the amplifier 110. The collector of the bipolar transistor 420 is connected to another end of a resistance element 441, the base of the bipolar transistor 420 is connected to another end of the resistance element 440 and one end of the capacitor 430, and the bipolar transistor 420 has a common emitter. In addition, the RF signal RFin is input to the base of the bipolar transistor 420 via the capacitor 430 and the RF signal RFout3, which is obtained by amplifying this signal, is output from the collector of the bipolar transistor 420.

One end of the capacitor 430 is connected to the base of the bipolar transistor 420 and the RF signal RFin is input to the other end of the capacitor 430. The capacitor 430 removes a direct-current component from the RF signal RFin and prevents a direct-current component of a current that flows from the emitter of the bipolar transistor 423 from being supplied to the amplifier 110.

The bipolar transistors 421, 422 and 423, the capacitor 431 and the resistance element 440 form a bias circuit for supplying a bias current or a bias voltage to the bipolar transistor 420. Specifically, the bipolar transistors 421, 422 and the capacitor 431 generate a voltage of a prescribed level (for example, around 2.6 V) at the base of the bipolar transistor 421. The configuration of this bias circuit is substantially the same as that of the bias circuit 120 and therefore detailed description thereof is omitted. The voltage Vreg is supplied to the collector of the bipolar transistor 423, the base of the bipolar transistor 423 is connected to the base of the bipolar transistor 421 and the emitter of the bipolar transistor 423 is connected to one end of the resistance element 440. One end of the resistance element 440 is connected to the emitter of the bipolar transistor 423 and the other end of the resistance element 440 is connected to the base of the bipolar transistor 420.

With the above-described configuration, a bias current or a bias voltage is supplied to the base of the bipolar transistor 420 from the emitter of the bipolar transistor 423 via the resistance element 440.

Next, the configuration of the voltage outputting circuit 410 will be described. The voltage outputting circuit 410 includes a current-voltage converting circuit 450, a filter circuit 460 and a voltage-level converting circuit 470.

The current-voltage converting circuit 450 is a circuit that outputs a voltage Vac (second voltage) that corresponds to the RF signal RFout3 output from the bipolar transistor 420. The current-voltage converting circuit 450 includes the resistance element 441. The voltage Vreg is supplied to one end of the resistance element 441 and the other end of the resistance element 441 is connected to the collector of the bipolar transistor 420. A current I1 that corresponds to the current of the RF signal RFout3 flows to the resistance element 441. Here, the voltage Vac, which is lower than the voltage Vreg by R1×I1, is generated at the other end of the resistance element 441, where R1 is the resistance value of the resistance element 441. The current I1 has a value that corresponds to the RF signal RFout3 and therefore the voltage Vac also has a value that corresponds to the RF signal RFout3.

The filter circuit 460 includes a resistance element 442 and a capacitor 432.

The voltage Vac is supplied to one end of the resistance element 442 and the other end of the resistance element 442 is connected to one end of the capacitor 432. The one end of the capacitor 432 is connected to the other end of the resistance element 442 and the other end of the capacitor 432 is grounded.

With the above-described configuration, the filter circuit 460 attenuates an alternating-current component of the voltage Vac, which is generated by the current-voltage converting circuit 450, and a direct-current voltage Vdc is output from the connection point between the resistance element 442 and the capacitor 432. In addition, although the filter circuit 460 is a low pass filter made up of a resistance element and a capacitor in this embodiment, the filter circuit 460 is not limited to this configuration.

The voltage-level converting circuit 470 is a circuit that converts the voltage Vdc supplied from the filter circuit 460 into the control voltages Vcont1 and Vcont2. The voltage-level converting circuit 470 includes bipolar transistors 424 and 425 and resistance elements 443, 444, 445 and 456.

The bipolar transistor 424 and the resistance elements 443 and 444 convert the voltage Vdc into the control voltage Vcont1. The collector of the bipolar transistor 424 is connected to another end of the resistance element 443, the voltage Vdc is supplied to the base of the bipolar transistor 424 and the emitter of the bipolar transistor 424 is grounded via the resistance element 444. The voltage Vreg is supplied to one end of the resistance element 443 and the other end of the resistance element 443 is connected to the collector of the bipolar transistor 424. One end of the resistance element 444 is connected to the emitter of the bipolar transistor 424 and the other end of the resistance element 444 is grounded. A current that flows through the bipolar transistor 424 changes in accordance with the voltage Vdc supplied to the base of the bipolar transistor 424. A current I2, which corresponds to the current that flows through the bipolar transistor 424, flows to the resistance element 443. Here, the control voltage Vcont1, which is lower than the voltage Vreg by I2×R2 is generated at the other end of the resistance element 443, where R2 is the resistance value of the resistance element 443. The current I2 has a value that corresponds to voltage Vdc and therefore the control voltage Vcont1 also has a value that corresponds to the voltage Vdc. In addition, the bipolar transistor 425 and the resistance elements 445 and 446 are configured in the same way as the bipolar transistor 424 and the resistance element 443 and 444, and the control voltage Vcont2 is generated at the other end of the resistance element 445. The voltage levels of the control voltages Vcont1 and Vcont2 can be adjusted by changing the resistance values of the resistance elements 443, 444, 445 and 446.

Next, the operation of the control voltage generating unit 140 will be described. When the signal level of the RF signal RFin input to the control voltage generating unit 140 is large, the current flowing through the bipolar transistor 420 increases and the voltage Vac decreases. Together with this, the voltage Vdc also decreases and the current flowing through the bipolar transistor 424 decreases. Therefore, the control voltage Vcont1 increases. On the other hand, when the signal level of the RF signal RFin input to the control voltage generating unit 140 is small, the current flowing through the bipolar transistor 420 decreases and the voltage Vac increases. Together with this, the voltage Vdc also increases and the current flowing through the bipolar transistor 424 increases. Therefore, the control voltage Vcont1 decreases.

Thus, the control voltage generating unit 140 operates so as to increase the control voltage Vcont1 at the time of intermediate power output, when the signal level of the RF signal RFin is comparatively large, and so as to decrease the control voltage Vcont1 at the time of small power output, when the signal level is comparatively small.

To summarize the operation of the bias circuit 120 and the control voltage generating unit 140 described above, the control voltage Vcont1, which is supplied to the bias circuit 120 by the control voltage generating unit 140, increases at the time of intermediate power output. Thus, the current that flows through the bipolar transistor 304 illustrated in FIG. 3 increases and the current that flows through the bipolar transistor 303 also increases. Therefore, gain expansion caused by there being an insufficient bias current at the time of intermediate power output can be suppressed.

On the other hand, the control voltage Vcont1, which is supplied to bias circuit 120 by the control voltage generating unit 140 decreases as the signal level of the RF signal RFin decreases. Thus, the current that flows through the bipolar transistor 304 illustrated in FIG. 3 decreases and the current that flows through the bipolar transistor 303 also decreases. Therefore, since the current that flows through the bipolar transistor 303 decreases at the time of small power output, current consumption of the bias circuit can be decreased.

Although a configuration has been described in which npn-type bipolar transistors are used in this embodiment, pnp-type bipolar transistors may be used instead of the npn-type bipolar transistors. Furthermore, MOSFETs may be used instead of the bipolar transistors in this embodiment. When a MOSFET is used instead of a bipolar transistor, "collector", "base" and "emitter" should be respectively read as "drain", "gate" and "source".

Next, changes that occur in currents and voltages in the control voltage generating unit 140 will be described while referring to FIGS. 5 and 6.

Figure 5:
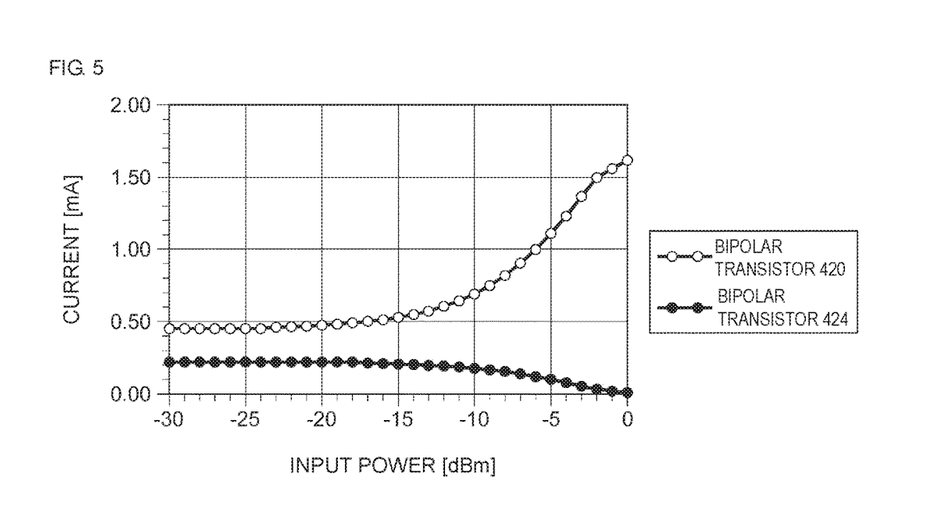
FIG. 5 is a graph illustrating simulation results of currents that flow through bipolar transistors in the control voltage generating circuit.

FIG. 5 is a graph illustrating simulation results of currents that flow through the bipolar transistors 420 and 424 in the control voltage generating circuit 140 illustrated in FIG. 4. In the graph illustrated in FIG. 5, the vertical axis represents current (mA) and the horizontal axis represents input power (dBm).

As illustrated in FIG. 5, the current that flows through the bipolar transistor 420 is comparatively small at the time of small power output (for example, at an input power of −30 dBm), suddenly begins to increase when the input power exceeds around −15 dBm, and is around 1.6 mA at the time of intermediate power output (for example, at an input power of 0 dBm). On the other hand, the current that flows through the bipolar transistor 424 is constant at around 0.2 mA at the time of small power output, but begins to decrease when the input power exceeds around −15 dBm and is 0.0 mA when the input power is 0 dBm.

Figure 6:
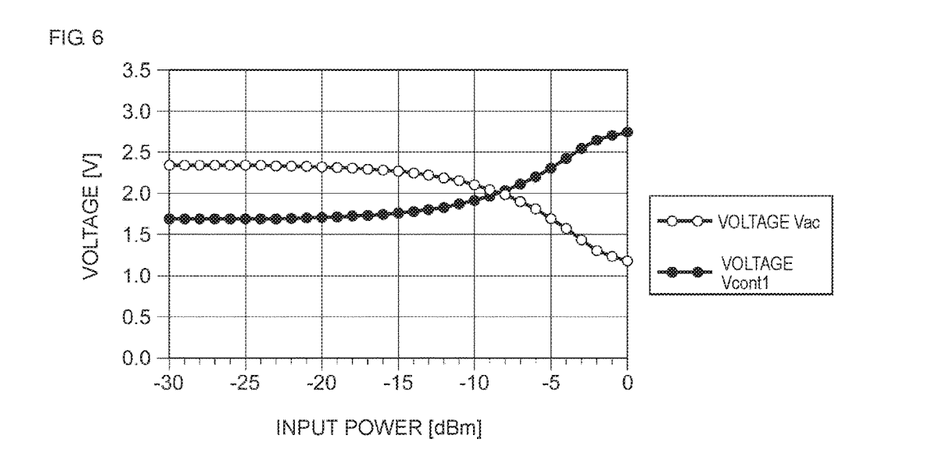
FIG. 6 is a graph illustrating simulation results of voltages in the control voltage generating circuit.

FIG. 6 is a graph illustrating simulation results of the voltages Vac and Vcont1 in the control voltage generating circuit 140 illustrated in FIG. 4. In the graph illustrated in FIG. 6, the vertical axis represents voltage (V) and the horizontal axis represents input power (dBm).

As illustrated in FIG. 6, it is clear that the voltage value of the voltage Vac decreases as the input power increases. Specifically, the voltage Vac decreases by around 1 V at the time of intermediate power output (for example, at an input power of 0 dBm) compared with at the time of small power output (for example, at an input power of −30 dBm). As illustrated in FIG. 5, this is because a comparatively large current flows to the bipolar transistor 420 at the time of intermediate power output. On the other hand, it is clear that the control voltage Vcont1 increases as the input power increases. Specifically, the control voltage Vcont1 increases by around 1 V at the time of intermediate power output (for example, at an input power of 0 dBm) compared with at the time of small power output (for example, at an input power of −30 dBm). As illustrated in FIG. 5, this is because the current that flows through the bipolar transistor 424 decreases at the time of intermediate power output.

From the simulation results illustrated in FIGS. 5 and 6 described above, it is clear that the control voltage generating unit 140 generates the control voltage Vcont1 that increases at the time of intermediate power output and decreases at the time of small power output in accordance with the signal level of the RF signal RFin. Thus, in the power amplification circuit 100, the control voltage Vcont1 is made to decrease as the signal level of the RF signal RFin decreases and the current between the emitter of the bipolar transistor 302, which supplies the bias current, and the ground can be made to decrease. Thus, current consumption at the time of small power output can be suppressed in the power amplification circuit 100.

An exemplary embodiment of the present disclosure has been described above. As a result of the power amplification circuit 100 being provided with the control voltage generating unit 140 and the bipolar transistor 304 of the bias circuit 120, the current between the emitter of the bipolar transistor 302, which supplies the bias current, and the ground can be adjusted. Therefore, gain expansion caused by there being an insufficient bias current can be suppressed by supplying a current to the bipolar transistor 303 at the time of intermediate power output and current consumption can be reduced by reducing the current that flows through the bipolar transistor 303 at the time of small power output.

In addition, as illustrated in FIG. 4, the control voltage generating unit 140 can be formed of the bipolar transistor 420, which amplifies the RF signal RFin by imitating the amplification operation of the amplifier 110, and the voltage outputting circuit 410, which generates the control voltages Vcont1 and Vcont2 in accordance with the signal level of the amplified signal. The control voltage generating unit 140 is not limited to this configuration.

In addition, as illustrated in FIG. 4, the voltage outputting circuit 410 can be formed of the current-voltage converting circuit 450, which converts the current of the amplified RF signal RFin into a voltage, and the voltage-level converting circuit 470, which converts that voltage into the control voltages Vcont1 and Vcont2. The voltage outputting circuit 410 is not limited to this configuration.

In addition, as illustrated in FIG. 4, the voltage outputting circuit 410 can further include the filter circuit 460 that attenuates an alternating-current component of a voltage output from the current-voltage converting circuit 450. The voltage outputting circuit 410 is not limited to this configuration.

The purpose of the embodiment described above is to enable easy understanding of the present disclosure and the embodiment is not to be interpreted as limiting the present disclosure. The present disclosure can be changed or improved without departing from the gist of the disclosure and equivalents to the present disclosure are also included in the scope of the present disclosure. In other words, appropriate design changes made to the embodiment by one skilled in the art are included in the scope of the present disclosure so long as the changes have the characteristics of the present disclosure. For example, the elements included in the embodiment and the arrangements, materials, conditions, shapes, sizes and so forth of the elements are not limited to those exemplified in the embodiment and can be appropriately changed. In addition, the elements included in the embodiment can be combined as much as technically possible and such combined elements are also included in the scope of the present disclosure so long as the combined elements have the characteristics of the present disclosure.

While various embodiments of the disclosure have been described above, it is to be understood that variations and modifications will be apparent to those skilled in the art without departing from the scope and spirit of the disclosure. The scope of the invention, therefore, is to be determined solely by the following claims.

What is claimed is:

1. A power amplification circuit comprising:
    a first amplifier that is input with a first signal and outputs a second signal obtained by amplifying the first signal;
    a bias circuit that supplies a bias current or a bias voltage to the first amplifier; and
    a control voltage generating circuit that generates a control voltage in accordance with a signal level of the first signal,
    wherein the bias circuit includes:
        a first transistor, the bias current or bias voltage being output from an emitter or source of the first transistor,
        a second transistor that is provided between the emitter or the source of the first transistor and ground; and
        a third transistor, wherein the control voltage is supplied to a base or gate of the third transistor and an emitter or source of the third transistor supplies a first current or a first voltage to a base or gate of the second transistor,
    wherein the control voltage generating circuit includes:
        a second amplifier that is input with the first signal and outputs a third signal obtained by amplifying the first signal, and
        a voltage outputting circuit that outputs the control voltage in accordance with the third signal, and
    wherein the voltage outputting circuit includes:
        a current-voltage converting circuit that outputs a second voltage in accordance with a current of the third signal, and
        a voltage-level converting circuit that converts the second voltage into the control voltage such that the value of the first current or the first voltage is larger when the signal level of the first signal is the first level than when the signal level of the first signal is the second level.

2. The power amplification circuit according to claim 1, wherein:
    the voltage outputting circuit further includes a filter circuit that attenuates an alternating-current component of the second voltage, and
    the voltage-level converting circuit converts the second voltage, the alternating-current component of which has been attenuated, into the control voltage.

3. The power amplification circuit according to claim 1, wherein the emitter or the source of the first transistor is connected to a collector or drain of the second transistor.

4. The power amplification circuit according to claim 1, wherein the first transistor, the second transistor, and the third transistor are hetero-junction-bipolar transistors.

5. A power amplification circuit comprising:
    a first amplifier that is input with a first signal and outputs a second signal obtained by amplifying the first signal;
    a bias circuit that supplies a bias current or a bias voltage to the first amplifier;
    a control voltage generating circuit that generates a control voltage in accordance with a signal level of the first signal; and
    a second amplifier stage that amplifies the second signal and a second bias circuit that supplies a second bias current or a second bias voltage to an amplifier of the second amplifier stage,
    wherein the bias circuit includes:
        a first transistor, the bias current or bias voltage being output from an emitter or source of the first transistor,
        a second transistor that is provided between the emitter or the source of the first transistor and ground; and
        a third transistor, wherein the control voltage is supplied to a base or gate of the third transistor and an emitter or source of the third transistor supplies a first current or a first voltage to a base or gate of the second transistor,
    wherein the control voltage generating circuit includes:
        a second amplifier that is input with the first signal and outputs a third signal obtained by amplifying the first signal, and
        a voltage outputting circuit that outputs the control voltage in accordance with the third signal,
    wherein the control voltage generating circuit generates a second control voltage in accordance with the signal level of the first signal, and
    wherein the second bias current or the second bias voltage is based on the second control voltage.

6. The power amplification circuit according to claim 5, wherein the emitter or the source of the first transistor is connected to a collector or drain of the second transistor.

7. The power amplification circuit according to claim 5, wherein the first transistor, the second transistor, and the third transistor are hetero-junction-bipolar transistors.

* * * * *